(12) United States Patent
Kubo et al.

(10) Patent No.: US 9,294,059 B2
(45) Date of Patent: Mar. 22, 2016

(54) ACOUSTIC DEVICE AND METHOD OF REPRODUCING ACOUSTIC SIGNAL

(75) Inventors: Masahiko Kubo, Kobe (JP); Yuji Tomita, Kobe (JP); Masanobu Maeda, Kobe (JP); Nahoko Akai, Kobe (JP)

(73) Assignee: FUJITSU TEN LIMITED, Hyogo (JP)

( * ) Notice: Subject to any disclaimer, the term of this patent is extended or adjusted under 35 U.S.C. 154(b) by 517 days.

(21) Appl. No.: 13/695,360

(22) PCT Filed: Apr. 19, 2011

(86) PCT No.: PCT/JP2011/059617
§ 371 (c)(1),
(2), (4) Date: Oct. 30, 2012

(87) PCT Pub. No.: WO2011/136085
PCT Pub. Date: Nov. 3, 2011

(65) Prior Publication Data
US 2013/0101138 A1   Apr. 25, 2013

(30) Foreign Application Priority Data

Apr. 27, 2010   (JP) .................................. 2010-101784

(51) Int. Cl.
*H03G 3/00* (2006.01)
*H03G 3/20* (2006.01)
(Continued)

(52) U.S. Cl.
CPC ............... *H03G 3/20* (2013.01); *H03G 3/3005* (2013.01); *H03G 5/165* (2013.01); *H04R 27/00* (2013.01); *H04R 2430/01* (2013.01); *H04R 2499/13* (2013.01)

(58) Field of Classification Search
CPC ........... H03G 3/30; H03G 3/20; H03G 5/165; H03G 3/3005; H04R 27/00; H04R 2430/01; H04R 2499/13

USPC ............. 381/107, 104, 120, 123, 119, 81, 80, 381/77; 702/199, 189; 327/339, 336
See application file for complete search history.

(56) References Cited

U.S. PATENT DOCUMENTS

| 5,745,057 A | 4/1998 | Sasaki et al. |
| 2006/0193397 A1 | 8/2006 | Kirisawa |
| 2008/0013745 A1* | 1/2008 | Chen .............................. 381/57 |

FOREIGN PATENT DOCUMENTS

| CN | 101282111 A | 10/2008 |
| JP | Y2-1-17854 | 5/1989 |

(Continued)

OTHER PUBLICATIONS

International Preliminary Report on Patentability issued Japanese Patent Application No. PCT/JP2011/059617 dated Dec. 10, 2012, The Attached Translation is dated Jul. 12, 2011.

(Continued)

*Primary Examiner* — Vivian Chin
*Assistant Examiner* — Con P Tran
(74) *Attorney, Agent, or Firm* — Oliff PLC

(57) ABSTRACT

An acoustic device, which reproduces an acoustic signal of one acoustic source selected from a plurality of acoustic sources. A first averaging unit averages signal levels of the acoustic signal for a first time period to obtain a first average signal. A second averaging unit averages the signal levels for a second time period shorter than the first time period to obtain a second average signal. A selecting unit selects either the first average signal or the second average signal as one signal having a signal level higher than the other. A gain decreasing unit decreases a gain of the acoustic signal according to the signal level of the one signal if the signal level of the one signal is higher than a threshold value determined according to the one acoustic source. A correcting unit corrects the signal levels of the acoustic signal according to the gain.

6 Claims, 13 Drawing Sheets

(51) Int. Cl.
*H03G 3/30* (2006.01)
*H03G 5/16* (2006.01)
*H04R 27/00* (2006.01)

(56) References Cited

FOREIGN PATENT DOCUMENTS

| | | |
|---|---|---|
| JP | A-2-188013 | 7/1990 |
| JP | A-9-93688 | 4/1997 |
| JP | A-2001-185969 | 7/2001 |
| JP | A-2001-359184 | 12/2001 |
| JP | A-2004-56479 | 2/2004 |
| JP | A-2006-238064 | 9/2006 |

OTHER PUBLICATIONS

Office Action issued in Japanese Patent Application No. 2010-101784 dated Feb. 25, 2014 (with translation).
Office Action/Search Report issued in Chinese Patent Application No. 201180021584.5 dated Mar. 12, 2014 (with translation).
Office Action issued in Chinese Patent Application No. 201180021584.5 dated Aug. 29, 2014 (with translation).
Office Action issued in Japanese Patent Application No. 2010-101784 dated Nov. 12, 2013 (with translation).
International Search Report issued in International Patent Application No. PCT/JP2011/059617 dated Jul. 12, 2011.

* cited by examiner

FIG. 3
(a)
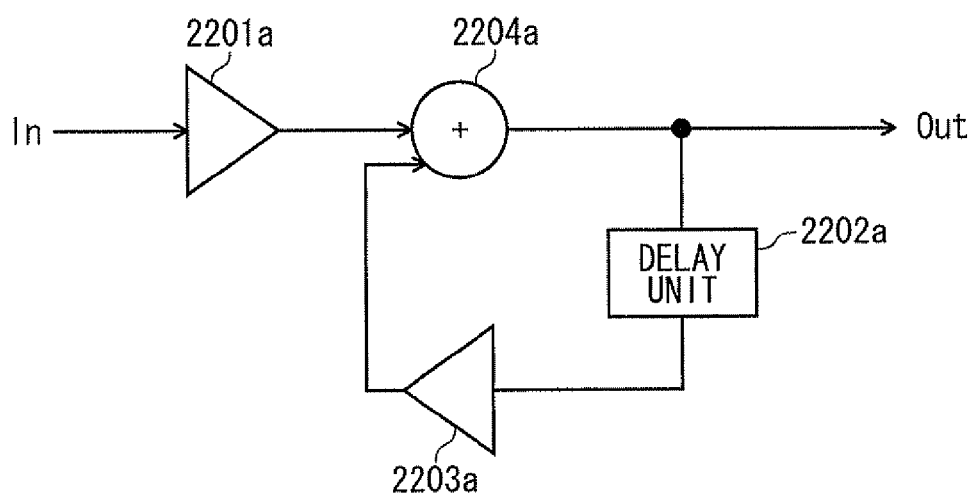
(b)
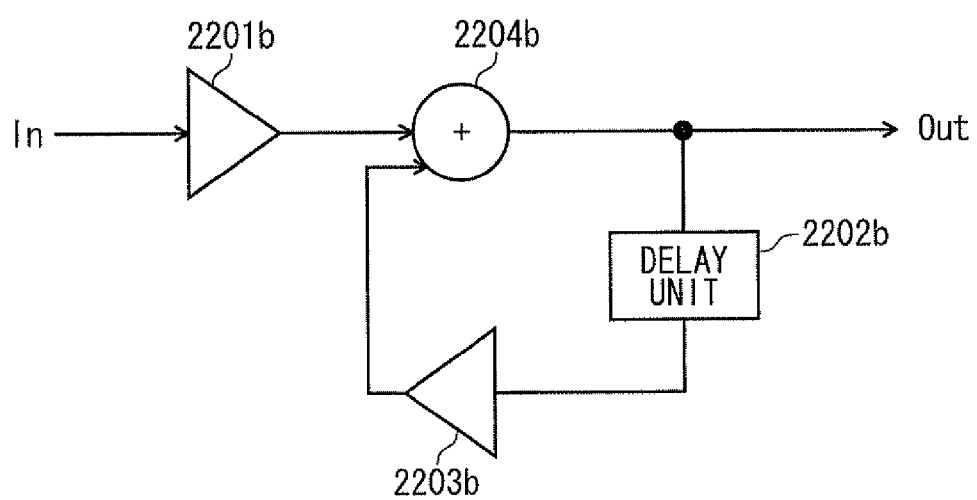

*FIG. 4*
(a)
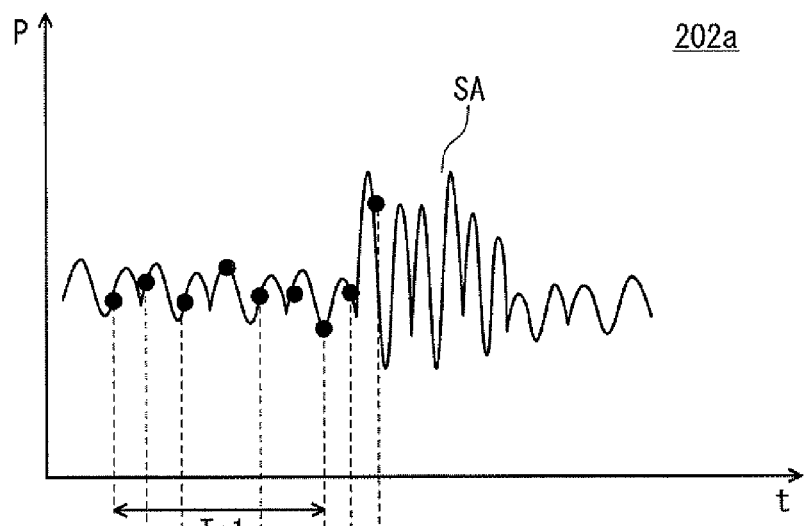
(b)
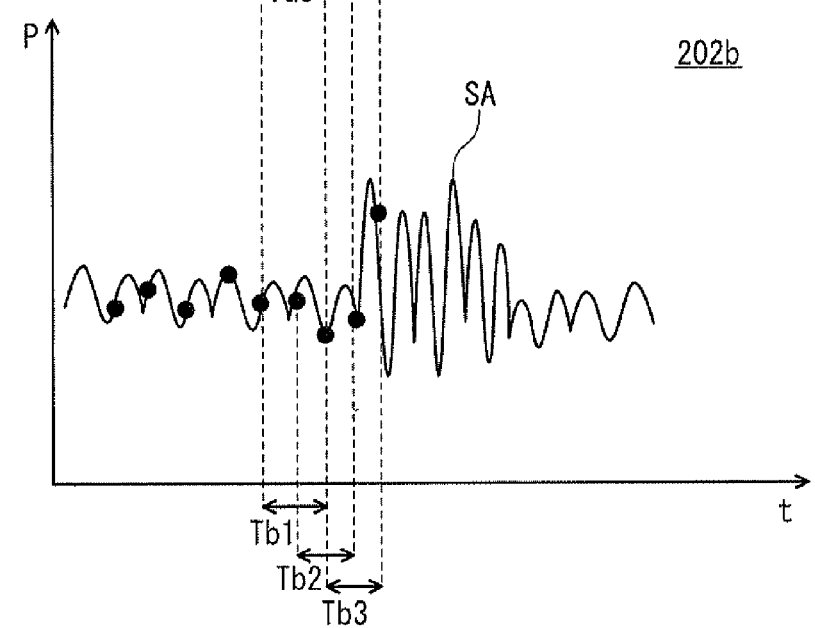

FIG. 5
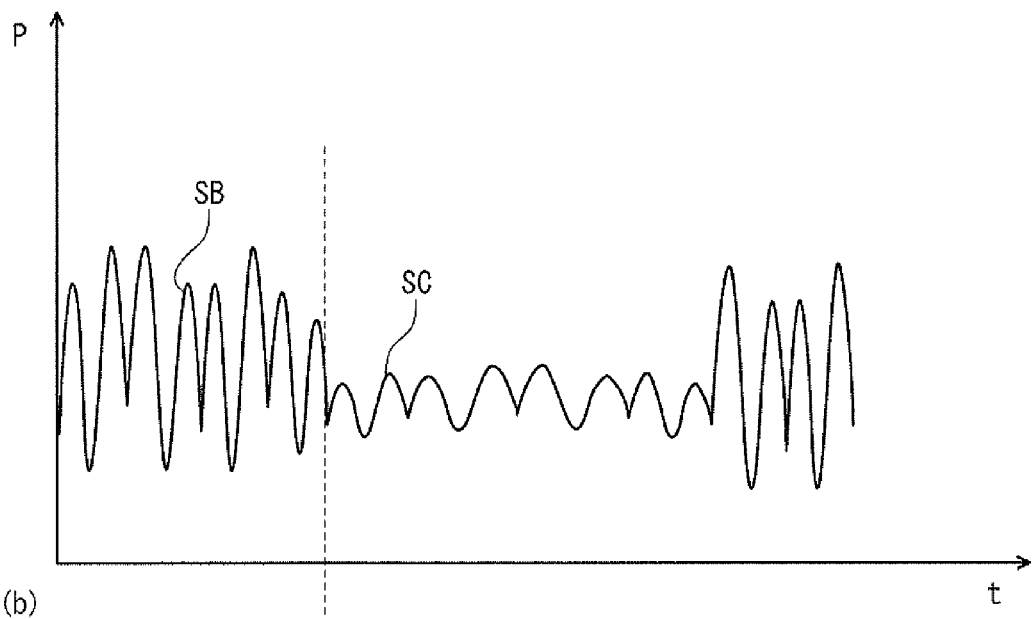
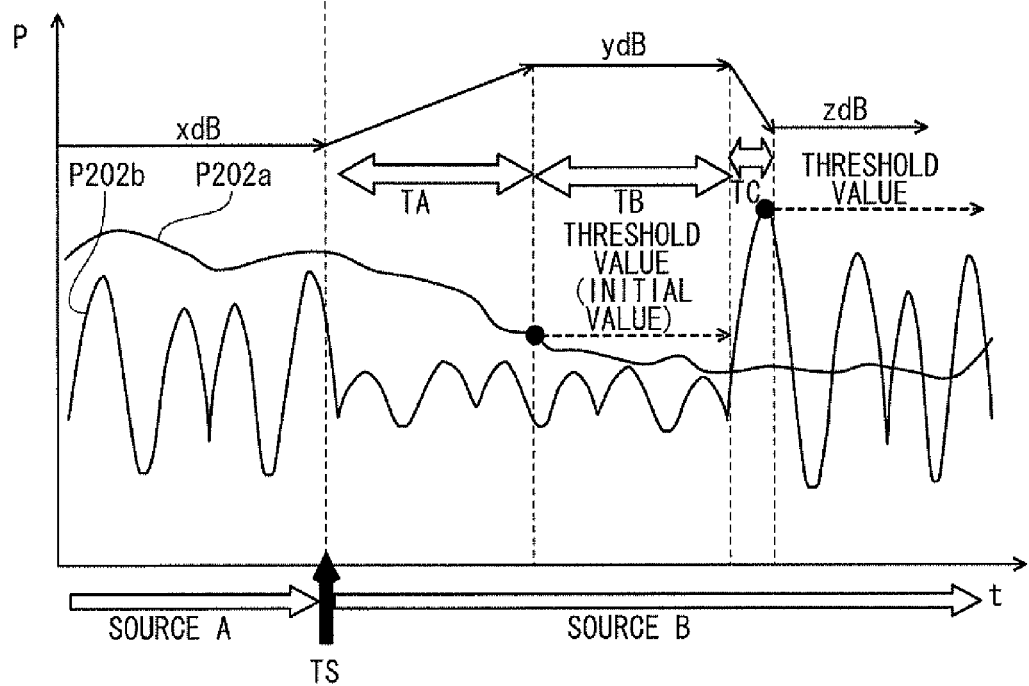

ACOUSTIC DEVICE AND METHOD OF REPRODUCING ACOUSTIC SIGNAL

TECHNICAL FIELD

The present invention relates to a technology to reproduce sound through obtaining acoustic signals from a plurality of acoustic sources.

BACKGROUND ART

In general, an acoustic device in the related art, which is represented by a stand-alone type component audio or an acoustic device for vehicle installation, has a reproducing function of a plurality of acoustic sources such as a radio tuner, a CD (Compact Disc), and an AUX (Auxiliary) input that is an external input terminal. Particularly, in the acoustic device for vehicle installation, since a display is provided by fusion with a navigation system, a DVD (Digital Versatile Disc) player and a TV tuner are added as acoustic sources, and the number of acoustic sources has been increased.

In order to adjust a volume with which a user desires to listen to during reproduction of such acoustic sources, the user performs volume adjustment through operating a sound volume. However, in an acoustic device that can select and reproduce any one of a plurality of acoustic sources, if an acoustic source being reproduced is switched to a different sound source, a volume change occurs due to a difference in characteristics (for example, a reproduction band and a kind of an analog/digital signal).

Even if the switching is made in the same acoustic sources, the volume change occurs in a radio receiver or the like due to a difference in modulation degree between radio waves. Further, in the case where a signal is input from an external acoustic device, the volume change occurs depending on the volume of the external acoustic device. To address this problem, in the related art, there is an acoustic device having a volume adjustment function based on the volume balance between acoustic sources beforehand so that no volume change occurs even if the acoustic source is switched.

However, parameters of the volume adjustment are determined at a design stage and have fixed values for respective acoustic sources, and thus it is not possible to change them after shipment. A technology to establish an AGC (Auto Gain Control) circuit in an acoustic device to cope with the above-described case is disclosed, for example, in Japanese Patent Application Publication No. 2001-359184 (Patent Document 1).

SUMMARY OF INVENTION

Problems to be Solved by Invention

However, the technology disclosed in Patent Document 1 has the problems that since the gain of which the control is necessary is calculated from the result of calculation of the signal level in the predetermined period of the input signal and thus it is necessary to correct the signal level, the signal level value is greatly changed in a musical piece or the like, which has a tendency that the change of the signal level in the acoustic source is big, and thus the user feels the sense of incongruity to the reproduced sound. Further, if the correction of the signal level is not performed in the same acoustic source, the signal level becomes excessively high to cause the saturation of the signal level, and thus allophones may occur.

Accordingly, the present invention is to solve at least a part of the above-described problems, and an object of the present invention is to provide a technology that makes a level adjustment of an acoustic signal so that a user does not feel the sense of incongruity to a sound.

Means for Solving Problems

In order to solve at least one of the above-described problems, the present invention may take aspects listed below.

(1) An acoustic device configured to reproduce an acoustic signal of one acoustic source which is selected from a plurality of acoustic sources, the acoustic device including:
  first averaging means for averaging signal levels of the acoustic signal for a first time period to obtain a first average signal;
  second averaging means for averaging the signal levels of the acoustic signal for a second time period which is shorter than the first time period to obtain a second average signal;
  selecting means for selecting either the first average signal or the second average signal as one signal having a signal level higher than the other;
  gain decreasing means for decreasing a gain of the acoustic signal according to the signal level of the one signal, in a case where the signal level of the one signal is higher than a threshold value which is determined according to the one acoustic source; and
  correcting means for correcting the signal levels of the acoustic signal according to the gain.

(2) The acoustic device as described in (1), further including:
  threshold value updating means for updating the threshold value with the signal level of the one signal, in a case where the signal level of the one signal is higher than the threshold value.

(3) The acoustic device as described in (1) or (2), further including:
  threshold value determining means for determining an initial value of the threshold value according to the signal level of the one signal which is first selected by the selecting means; and
  gain determining means for determining an initial value of the gain according to the initial value of the threshold value.

(4) The acoustic device as described in (3), further including gain changing means for gradually changing the gain, in a case where the initial value of the gain is different from a previous value of the gain, from the previous value to the initial value, wherein the gain changing means is configured to increase the gain with a first speed, and decrease the gain with a second speed that is higher than the first speed.

(5) The acoustic device as described in (4), wherein the gain changing means is configured to change the gain with a higher speed in accordance with a greater difference between the previous value and the initial value.

(6) A method of reproducing an acoustic signal of one acoustic source which is elected from a plurality of acoustic sources, the method including:
  averaging signal levels of the acoustic signal for a first time period to obtain a first average signal;
  averaging the signal levels of the acoustic signal for a second time period which is shorter than the first time period to obtain a second average signal;
  selecting either the first average signal or the second average signal as one signal having a signal level higher than the other;
  decreasing a gain of the acoustic signal according to the signal level of the one signal, in a case where the signal level of the one signal is higher than a threshold value which is determined according to the one acoustic source; and correcting the signal levels of the acoustic signal according to the gain.

Advantageous Effects of Invention

According to the configuration described in (1) to (6), since the gain of the acoustic signal is decreased in the case where the signal level of the acoustic signal is higher than the threshold value which is determined according to the acoustic source of which the signal level of the acoustic signal is selected, a user is prevented from feeling the sense of incongruity to the sound due to a frequent change of the gain, and allophones due to the saturation of the acoustic signal in the case where the change of the level of the acoustic signal is big can be prevented from occurring.

According to the configuration described in (2), if the level of the signal selected by the selecting means is higher than the threshold value, the threshold value is updated with the level of the signal, and thus the saturation of the acoustic signal having a higher signal level than the threshold value can be prevented so as to provide a comfortable sound to the user.

According to the configuration described in (3), the initial value of the gain of the acoustic signal is determined according to the level of the signal that is the initial value of the threshold value, and thus it is possible to reduce user's efforts to manually adjust volume with respect to the change of the level of the acoustic signal according to a switching of the acoustic source.

According to the configuration described in (4), the level of the acoustic signal can be quickly decreased in the case where the saturation of the acoustic signal is possible, and the user is prevented from feeling the sense of incongruity for the rise of the volume in the case of increasing the gain.

According to the configuration described in (5), the sound can be quickly adjusted to a signal level that is easy to hear the sound without the necessity that the user manually adjusts the volume.

BRIEF DESCRIPTION OF DRAWINGS

FIG. 3 is a diagram illustrating a configuration example of a circuit for detecting a signal level in another calculating period.

FIG. 4 is a diagram illustrating an example of a signal process of each circuit illustrated in FIG. 3.

FIG. 5 is a diagram illustrating an example of a signal process of a signal level comparing unit illustrated in FIG. 2.

MODE TO CARRY OUT INVENTION

Hereinafter, preferred embodiments of the present invention will be described in detail with reference to the accompanying drawings.

First Embodiment

1. Configuration 1-1. Acoustic Device

Figure 1:
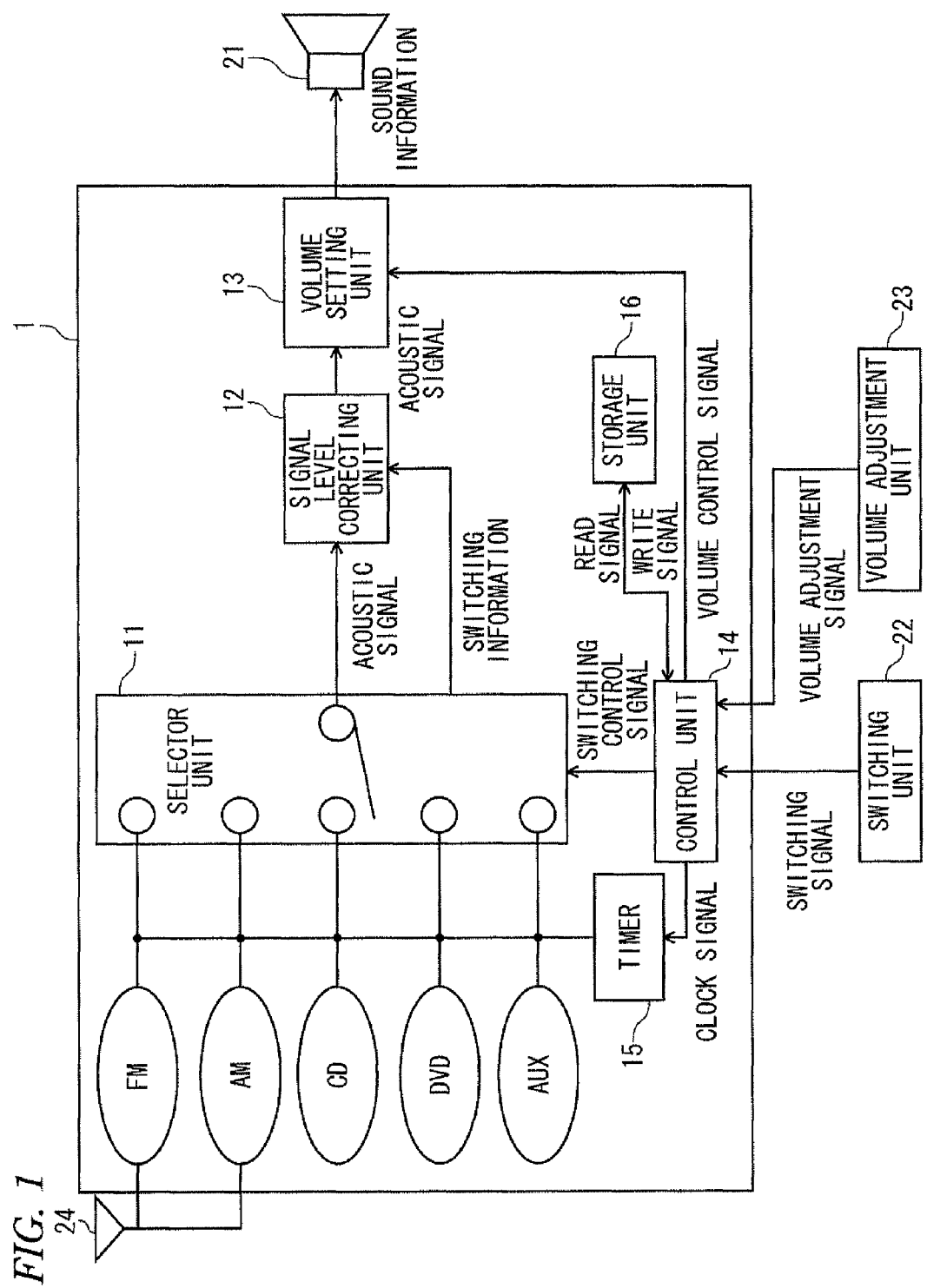
FIG. 1 is a block diagram illustrating an acoustic device according to a first embodiment of the present invention.

As illustrated in FIG. 1, an acoustic device 1 according to a first embodiment of the present invention is a device that can reproduce an acoustic signal of an acoustic source (hereinafter referred to as a "source") selected from a plurality of acoustic sources, and includes a selector unit 11, a signal level correcting unit 12, a volume setting unit 13, a control unit, a timer 15, and a storage unit 16. The selector unit 11 performs switching of various kinds of sources according to a user's source switching operation. The signal level correcting unit 12 performs correction of the signal level according to the level of the acoustic signal of the switched source. The volume setting unit 13 sets the volume according to the user's operation. The control unit 14 outputs a control signal to each unit of the acoustic device 1. The timer 15 counts the time until the gain control to be described later. The storage unit 16 stores therein data such as a sound file according to an instruction signal from the control unit 14. Through the acoustic device 1 having the above-described configuration, sound information in which a predetermined signal level has been adjusted to correspond to a predetermined volume level.

The selector unit 11 receives a switching signal that is caused by a user's operation of a switching unit 22, among various sources such as FM/AM radio broadcasts, CD, DVD, and AUX, etc. through the control unit 14 as a switching control signal, and selects a predetermined acoustic source (one acoustic source in the present invention). The acoustic signal of the selected source is output to the signal level correcting unit. Further, the selector unit 11 receives the switching control signal from the control unit 14 which has received the switching signal of the switching unit 22, and outputs switching information after switching the source to the signal level correcting unit 12.

The signal level correcting unit 12 calculates a gain of the level of the acoustic signal based on the acoustic signal of the source received from the selector unit 11 and the switching information of the acoustic source, and corrects the signal level.

As the detailed processing operation of the signal level correcting unit 12, in the case where the switching information is not received from the selector unit 11, the signal level correcting unit 12 averages signal levels of the acoustic signal for a predetermined calculation time period based on the acoustic signal of the acoustic source being selected, averages the signal levels of the acoustic signal for a calculation time period which is shorter than the predetermined calculation time period, and selects either of the averaged signal levels as one signal level that is higher than the other. That is, the signal level correcting unit 12 functions as first averaging means, second averaging means, and selecting means according to the present invention.

Further, if the selected signal level is higher than a threshold value that is determined according to the acoustic source being selected, the signal level correcting unit decreases a gain of the acoustic signal, and corrects the signal level of the acoustic signal based on the gain. On the other hand, if the selected signal level is higher than the threshold value that is determined according to the acoustic source, the signal level correcting unit 12 functions as gain decreasing means, correcting means, and threshold value updating means according to the present invention.

If the switching information of the source is received from the selector unit 11, the signal level correction unit 12 receives an input of the acoustic signal from the source selected through switching, and sets an initial value of the threshold value according to the acoustic source selected through switching based on the selected signal level. That is, the selected signal level becomes the initial value of the threshold value. The signal level correcting unit 12 derives an initial value of the gain of the acoustic signal of the acoustic source after the switching based on the signal level that becomes the initial value of the threshold value, and corrects the signal levels of the acoustic signal based on the initial value of the gain. That is, the signal level correcting unit 12 functions as threshold value determining means and gain determining means according to the present invention. Through this, a user is prevented from feeling the sense of incongruity to the sound due to a frequent change of the gain, and allophones due to the saturation of the acoustic signal in the case where the change of the level of the acoustic signal is large can be prevented from occurring.

The volume setting unit 13 receives the acoustic signal from the signal level correcting unit 12 and the volume control signal from the control unit 14 through a user's operation of a volume adjustment unit 23 to calculate the gain, and adjusts the signal level of the acoustic signal based on the gain. On the other hand, the acoustic device 1 has an acoustic effect linked to the volume level set by the volume setting unit 13. Examples of sound effects may include loudness that corresponds to an output of sound information in which a low tone is emphasized from a speaker 21, and feeling of normal position in which the placement relationship of a sound image that is a sensory sound source is expressed in a far and near direction in addition to in a left and right direction. The speaker 21 outputs the acoustic signal of which the gain has been controlled by the acoustic device as sound information.

The control unit 14 outputs a signal for controlling respective units of the acoustic device 1. In the case of receiving a switching signal from the switching unit 22, the control unit 14 outputs a switching control signal to the selector unit 11, while in the case of receiving the volume adjustment signal from the volume adjustment unit 23, the control unit 14 outputs the volume control signal. Further, in the case where the acoustic device 1 operates, the control unit 14 outputs a clock signal and an instruction signal of read and write of data with respect to the storage unit 16. Further, the control unit 14 performs various kinds of processes based on a predetermined program.

A timer 15 measures a count time for gain control through making the clock signal from the control unit 14 in synchronization with the acoustic signals of various kinds of acoustic sources.

The storage unit 16 mainly stores therein music data from CD or DVD. The storage unit 16 can read and write the data based on the instruction signal from the control unit 14. Further, the storage unit 16 can store a predetermined gain for each source to be described later, and read the gain in response to the switching of the source.

The switching unit 22 is an operation unit for switching the source selected by the user among the plural kinds of sources, and outputs the switching signal to the control unit 14. Further, the switching unit 22 is composed of a hard switch, a touch panel, a rotary knob, and the like. A reception antenna 24 is an antenna for receiving a broadcasting wave of an FM radio receiver, an AM radio receiver and a DTV (Digital Television).

1-2. Signal Level Correcting Unit

Figure 2:
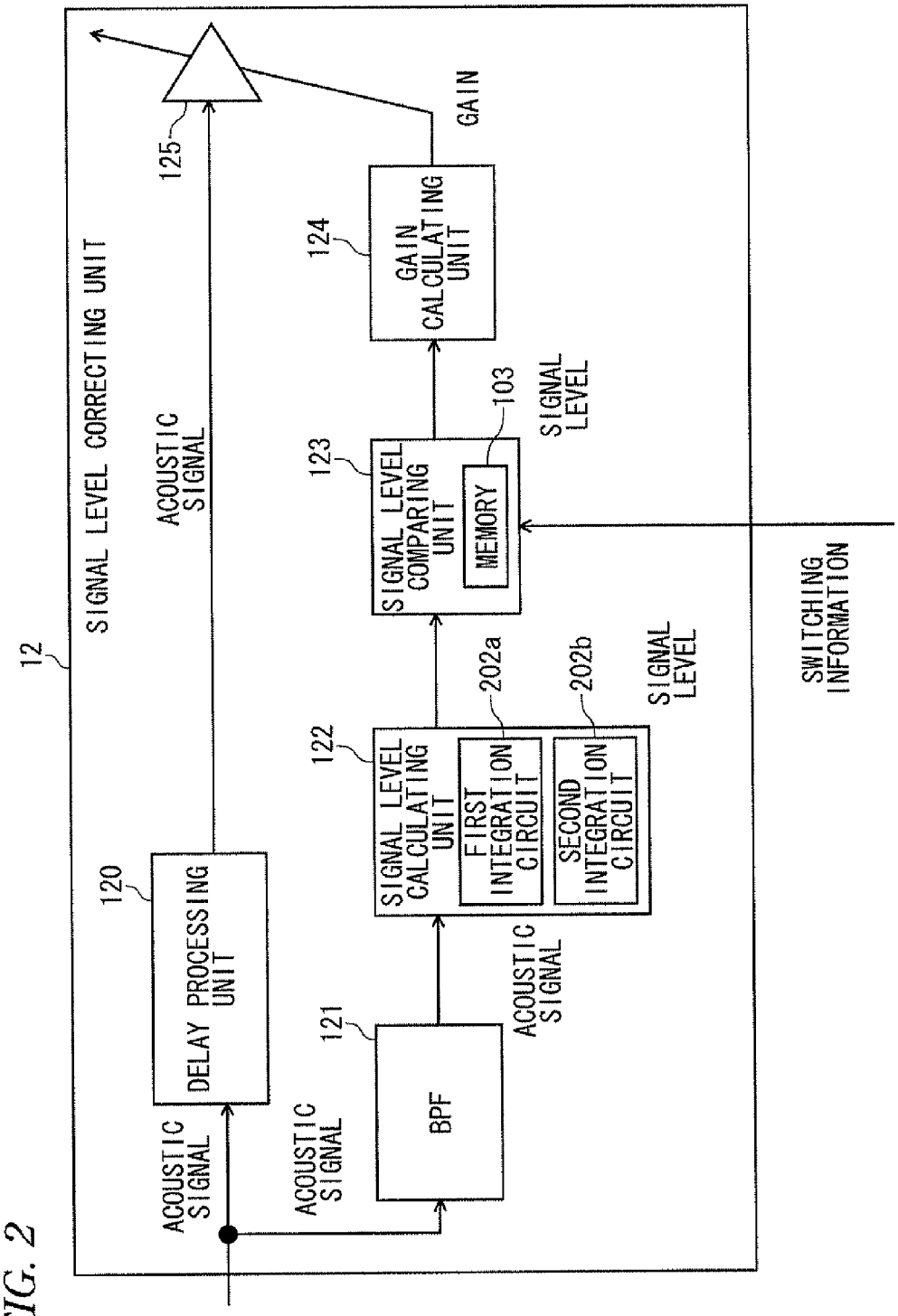
FIG. 2 is a block diagram illustrating a signal level correcting unit in FIG. 1.

As illustrated in FIG. 2, the signal level correction unit 12 includes a delay processing unit 120, a BPF (Band Pass Filter) 121, a signal level calculation unit 122, a signal level comparing unit 123, a gain calculation unit 124, and an amplifier 125. The delay processing unit 120 delays the acoustic signal. The BPF 121 is a filter that passes a predetermined frequency band component of the acoustic signal. The signal level calculation unit 122 averages the signal levels of the acoustic signal for a predetermined calculation time period to calculate the highest signal level. The signal level comparison unit 123 compares the signal level output from the signal level calculation unit 122 with the threshold value determined according to the acoustic source being selected, outputs the signal level to the gain calculation unit 124 if the signal level is higher than the threshold value, and sets the threshold value as the initial value according to the acoustic source through an input of the switching information of the acoustic source. The gain calculation unit 124 calculates the gain based on the signal levels from the signal level comparing unit 123. The amplifier 125 corrects the signal levels of the acoustic signal based on the calculated gain.

In order to adjust the signal levels of the acoustic signal output from the selector unit 11 based on the gain information output through the processing of the BFF 121, the signal level calculation unit 122, the signal level comparing unit 123, and the gain calculation unit 124.

The BPF 121 is a filter that passes only the sound band of the acoustic signal output from the selector unit 11. For example, the BPF 121 passes the frequency band signal of, for example, 0.3 kHz to 3.4 kHz, and filters other frequency band signals. Further, instead of establishing the BPF 121, a process of thinning out the sampling of the acoustic signal may be performed. Through this, the signal processing load can be decreased.

The signal level calculation unit 122 receives an input of the acoustic signal that is filtered by the BPF 121. This acoustic signal is an acoustic signal of a plural channel, and if the acoustic signals of two channels, for example, a left channel Lch and the right channel Rch, the signal level calculation unit 122 selects the signal level having the largest absolute value from the signals of Leh and Rch. Then, the signal level calculation unit 122 calculates a plurality of signal levels having different calculation time periods based on the selected signal level, and selects the highest signal level from the plurality of signal levels having different calculation time periods.

The selecting method is not limited to the method of selecting the signal level having the largest absolute value from the signals of Lch and Rch, but any other method that can derive one value from the information of the acoustic signal having the plurality of channels may be adopted. For example, the selection method may be a method of calculating an average value of the signal levels of all the channels.

This signal level calculating unit 122 is provided with a first integration circuit 202a and a second integration circuit 202b, and selects the highest signal level from the plurality of signal levels having different calculation time periods using these integration circuits. A specific example of this processing will be described using FIGS. 3 and 4.

Circuits illustrated in FIG. 3 are called integration circuits (hereinafter referred to as "circuits"). In the circuit 202a illustrated in (a), the signal level having the largest absolute value among Lch and Rch is amplified with a predetermined gain through the amplifier 2201a. The level signals are delayed for a predetermined time by a delay unit 2202a, are amplified through an amplifier 2203a, and then are added by an adder 2204a to be output.

Even in the circuit 202b illustrated in (b), the level signal is amplified with the predetermined gain through the amplifier 2201b. The level signals are delayed for the predetermined time by the delay unit 2202b, are amplified through an amplifier 2203b, and then are added by an adder 2204b to be output.

Here, a difference between the two integration circuits is an amplification factor between the amplifier 2203a of the circuit 202a and the amplifier 2203b of the circuit 202b. That is, the circuit 202a and the circuit 202b have different time constants. For example, the circuit 202a provided with the amplifier 2203a is composed of a circuit having a large time constant (a long time period that is targeted for calculation), and the circuit 202b provided with the amplifier 2203b is composed of a circuit having a small time constant (a short time period that is targeted for calculation).

As described above, in the case of calculating the signal levels in a case where the calculation time period of the circuit 202a is set to a calculation time period (first time period) of a predetermined length, since the signal levels in the circuit 202b are calculated for a calculation time period (second time period) that is shorter than the calculation time period of the circuit 202a, a signal in which the signal levels of the acoustic signal for the other calculation time period are averaged on the basis of the signal having the highest absolute value of the signal levels of Lch and Rch is obtained in each circuit. That is, the circuit 202a and the circuit 202b functions as the first averaging means and the second averaging means according to the present invention. Three or more integration circuits may be established in addition to a case where two integration circuits are established as described above. For example, an integration circuit having a small constant (for example, 40 μsec) may be added, and if the signal level of the integration circuit having the small time constant is highest, it is considered as a noise by the discontinuity of the signal, and the result of the calculation may not be output to the gain calculation unit 124.

In general, although the integration means by the integration circuit may be a calculation method through RMS (Root Mean Square) calculation using a buffer for calculating the time period, a processing load or a necessary buffer becomes larger in the RMS method. Because of this, by using the circuit as illustrated in FIG. 3, the amount of use of the buffer can be reduced. Further, since the circuit 202b as described above is used to detect the signal levels in a place where the signal changes are large such as idiopathic sounds, a through circuit may be used instead of the circuit 202b, under the assumption that the time constant is, for example, one sampling time.

In graphs illustrated in (a) and (b) of FIG. 4, a vertical axis represents a signal level (its unit is v: volt), and a horizontal axis represent time (its unit is msec: milliseconds). A signal having the largest absolute value SA (hereinafter referred to as a "signal SA") of the signal levels of Lch and Rch input to the circuit 202a, which is shown in (a) of FIG. 4, is provided for averaging of the signal levels in a predetermined calculation time period Ta. Specifically, the circuit 202a averages the levels of the signal SA in a first calculation time period. Then, the circuit 202a averages the levels of the signal SA in a calculation time period Ta2 which is the same calculation period as the first calculation period Ta1 and is shifted for one sampling period from a calculation period Ta1, and averages the levels of the signal SA in a calculation time period Ta1 which is the same calculation period as the calculation period Ta1 and is shifted for one sampling period from the calculation period Ta2. As described above, the circuit 202a calculates the signal levels of the averaged acoustic signal (a first average signal according to the present invention) with respect to a predetermined calculation time period Ta through averaging of the levels of the signal SA multiple times in the calculation time period Ta which is the same calculation period and is shifted for one sampling period.

Averaging of the signal levels of the signal SA input to the circuit 202b in a predetermined calculation time period Tb is illustrated in (b) of FIG. 4. The circuit 202b is different from the circuit 202a of (a) from the viewpoint of the length of the calculation time period. That is, the calculation time period Tb of the circuit 202b is shorter than the calculation time period Ta of the circuit 202a. Based on this calculation time period Tb, the signal levels of the signal SA are averaged while shifting the calculation time period Tb by one sampling period from the calculation time periods Tb1, Tb2, and Tb3. That is, as shifting the calculation time period Tb by one sampling period, the signal levels of the signal SA are averaged multiple times in the same calculation time period Tb. Through this, the signal levels of the acoustic signal which are averaged for the predetermined time period Tb that is shorter than the calculation time period Ta are calculated (a second average signal according to the present invention).

The signal level calculation unit 122 functions as the selecting means according to the present invention, and compares signal levels calculated for the respective circuits 202a and 202b to select the signal having a high signal level (one signal according to the present invention). Through this, a signal that follows the change of the signal SA slowly (at low speed) is output from the circuit 202a, and a signal that follows the change of the signal SA rapidly (at high speed) is output from the circuit 202b.

As illustrated in FIG. 2, the signal level comparing unit 123 compares the signal level calculated from the signal level calculation unit 122 with the threshold value recorded in a memory 103 provided in the signal level comparing unit 123, and if the signal level value is larger than the threshold value, the signal level comparing unit 123 outputs the signal level value to the gain calculation unit 124, and updates the threshold value recorded in the memory 103 with the signal level value. Here, the threshold value is a threshold value that is determined according to the acoustic source being selected. That is, the signal level comparing unit 123 functions as the threshold value updating means according to the present invention.

If switching information from the selector unit 11 is input to the signal level comparing unit 123, this means that the acoustic source is switched over, and the threshold value, which is determined according to the acoustic source before the switching that is recorded in the memory 103, is initialized. Then, the signal levels input from the signal level calculation unit after the switching is newly recorded in the memory 103, and becomes the initial value of the threshold value according to the acoustic source after switching. In this case, the signal level comparing unit 123 functions as the threshold value determination means according to the present invention. The signal levels which are input from the signal level calculation unit 122 after switching and are calculated by the signal level comparing unit 123 are output to the gain calculation unit 122, and the initial value of the gain of the acoustic source after switching is calculated. In this case, the gain calculation unit 124 functions as the gain determining means according to the present invention.

In graphs illustrated in (a) and (b) of FIG. 5, a vertical axis represents a signal level (its unit is v: volt), and a horizontal axis represent time (its unit is msec: milliseconds). As illustrated in (a) of FIG. 5, when the acoustic source being selected is source A, the selector unit 11 outputs a signal SB to the signal level correcting unit 12, and when source A is switched to source B at timing TS, the selector unit 11 outputs a signal SC of source B to the signal level correcting unit 12.

A signal P202a that is an output signal from the integration circuit 202a and a signal P202b that is an output signal from the integration circuit 202b are illustrated in (b) of FIG. 5. The signal level comparing unit 123 compares the signal level of the signal P202a that is higher than the signal level of the signal P202b with the threshold value recorded in the memory 103 in the period of source A. As a result, the gain calculation unit 124 calculates the gain based on either the signal P202a or the threshold value recorded in the memory 103 as one signal having a signal level higher than the other, and corrects the signal levels based on the calculated gain. A case where the threshold value recorded in the memory 103 is higher than the signal level of the signal P202 is illustrated in (b) of FIG. 5, and the correction of the signal level is performed according to the gain xdB.

Then, at a switching timing TS from source A to source B, the threshold value stored in the memory 103 is initialized. The initialization of the threshold value is performed just before the switching of source B, and the gain ydB is calculated by the gain calculation unit 124 based on the signal level of the signal P202a that is higher than the signal level of the signal P202b during the predetermined time period TA. Then, based on this gain ydB, the correction of the signal level is performed. By correcting the signal level through performing of the gain calculation based on the signal output from the integration circuit 202a having a long calculation time period (long constant), the signal levels can be adjusted in a state that a user is prevented from feeling the sense of incongruity to the sound change. On the other hand, the signal level (signal level at the end of the gain control which is the end of the time period TA) that has become the basis of the gain control is recorded in the memory 103.

Then, since there is no signal level that is higher than the initial value of the threshold value recorded in the memory 103 during the period TB, the gain of ydB is maintained. On the other hand, during TC, since the signal P202b is above the level of the signal P202a, and the level of the signal P202b is higher than the signal level at the time of the end of the period TA that is the initial value of the threshold value that is recorded in the memory 103, the gain zdB that is lower than ydB is calculated by the gain calculation unit 124 based on the signal level that is higher than the threshold value of the signals P202b in the period TC, and the signal level is corrected on the basis of the gain zdB. In this case, the gain calculation unit 124 functions as a gain decreasing means according to the present invention. On the other hand, the threshold value of the memory 103 is updated with the highest signal level of the signals P202b in the time period TC.

The switching timing of the above-described acoustic source may be the timing of changing a disc of CD or DVD, or the timing of switching between a program and CM during radio broadcasting except for a case where a user operates the switching unit 22. Further, if the gain is calculated just after the switching signal is input to the selector unit 11 in a source, such as CD or DVD, in which a silence period or a minute signal period that follows the silence period exists until an acoustic signal is actually input after the switching signal is input to the selector unit 11, an excessive gain may be calculated as the result of the calculation. Because of this, the gain calculation may be performed when the signal level that becomes the basis of the gain calculation becomes equal to or higher than a predetermined level.

The setting of the initial value of the threshold value or the setting of the initial value of the gain through the switching unit 22 may be performed in addition to the switching of the acoustic source. That is, in the case of a music file recorded in the storage unit 16 of the acoustic device 1 or a music file stored in a device that is connected from the outside of the acoustic device 1 such as USB audio, the signal level of the music file that is reproduced after the switching is set as the initial value through initialization of the threshold value of the memory 103 for each file switching (track switching), and the initial value of the gain may be calculated based on this signal level.

Unlike the switching of the track of CD or DVD, a music file stored in the storage unit 16 in the acoustic device 1 or music file data stored in the USB audio has sound levels that greatly differ for each sound file data, and thus a comfortable sound can be provided to the user through performing of the gain control at the switching timing of such a file.

The gain calculation unit 124 calculates the gain that is targeted during the gain control (hereinafter referred to as a "target gain"), and compares this target gain with the current gain (hereinafter referred to as the "current gain"). If the target gain is larger than the current gain, the gain calculation unit 124 increases the current gain, while if the target gain is smaller than the current gain, the gain calculation unit 124 decreases the current gain. Through this, the gain value of the acoustic signal level is updated. That is, the gain calculation unit 124 functions as the gain changing means according to the present invention.

In order to change the signal level input from the signal level 123 to the target gain, the gain calculation unit 124 may output a coefficient that a product with the input signal level becomes a constant value (reference level) as a gain. For example, if it is assumed that the input level is 0.8 v and the reference level is 1.0 v, the output coefficient becomes 1.25. Further, in the case where the signal level is in the range of a predetermined level, the conversion may be made on the basis of a calculation table that outputs a gain that corresponds to the range.

Further, in order to calculate a target gain, the gain calculation unit 124 may make the product with the signal level and the target gain become a predetermined constant, or divides the size of the input signal level into several level ranges, and for example, if the signal level is included in a predetermined level range, the gain calculation unit 124 may output a predetermined target gain.

If it is known in advance that the level of the acoustic signal is low as a tendency of the sound source, weighting of the acoustic source may be performed. For example, if it is known in advance that the signal level is lowered by the switching from CD to AUX, a gain for each acoustic source may be stored in the storage unit 16 in advance, and the signal level may be corrected using the gain when the acoustic source is switched to AUX.

The amplifier 125 functions as a correcting means according to the present invention, and corrects the signal levels of the acoustic signal according to a gain increase value and a gain decrease value calculated by the gain calculation unit 124.

Since the gain in which the signal level does not exceed the threshold value is not changed through the above-described process, a user is prevented from feeling the sense of incongruity to the sound due to the frequent change of the gain. On the other hand, if the signal level exceeds the threshold value, allophones due to the saturation of the acoustic signal that occurs to reduce the gain in the case where the change of the level of the acoustic signal is big can also be prevented from occurring. Further, in the case of the acoustic signal having a level that is higher than the level of the threshold value, the saturation of the acoustic signal can be prevented, and thus the providing of a comfort sound to the user becomes possible. Further, with respect to the change of the level of the acoustic signal according to the switching of the acoustic source, user's efforts to manually adjust the volume can be reduced.

The tracking speed for the change of the signal level in the gain control may be changed by the gain being applied to the current output sound. For example, an average signal level is pre-stored in the memory 103 with respect to, for example, the acoustic signal of CD, and in the case of the signal level within a predetermined gain range (for example, ±3 dB) from the average signal level, the tracking speed is set to be lower than that in a typical state. Further, by making the signal level not changed, the frequency of changing the signal levels is suppressed, and thus the providing of the sound to the user can be stabilized.

The tracking speed at which the signal level is not saturated by a difference between the current gain and the target gain is calculated, and the tracking speed may be changed while the current gain tracks toward the target gain. In the case of a broadcasting wave, a control may be performed in a manner that if the reception sensitivity thereof is equal to or higher than a predetermined level, the tracking speed is lowered, while if the reception sensitivity is equal to or lower than the predetermined level, the tracking speed for the change of the signal level us heightened in the gain control.

2. Operation

Figure 6:
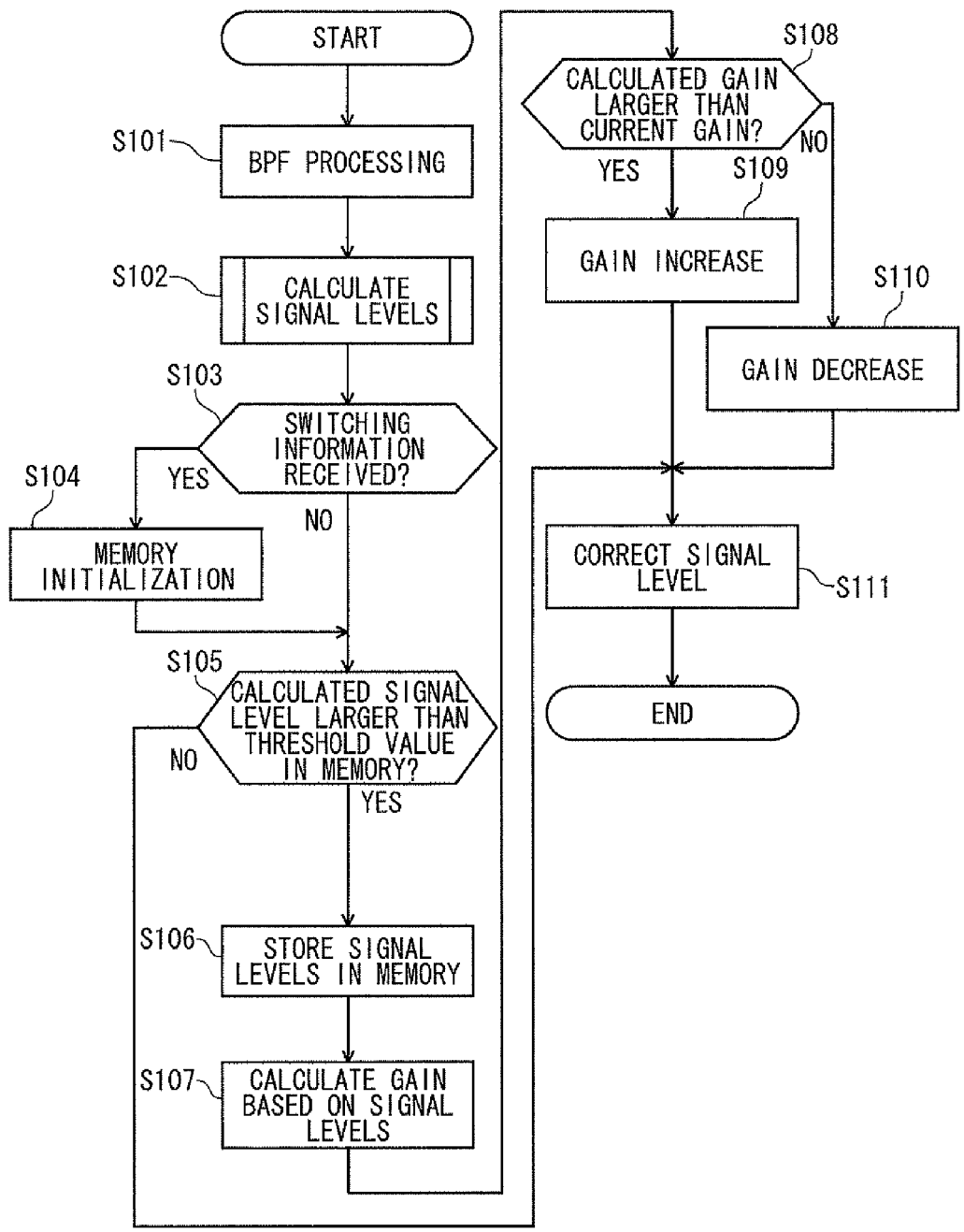
FIG. 6 is a flowchart illustrating a process executed by the signal level correcting unit illustrated in FIG. 2.

Hereinafter, a process that is executed by the signal level correcting unit 12 will be described using FIG. 6. The BPF 121 of the signal level correcting unit 12 passes only a sound band of the acoustic signal output from the selector unit 11 (step S101). Then, the highest level value of the signal levels is calculated (step S102). The details of this level calculation process will be described later with reference to FIG. 7.

Then, it is determined whether the signal level correcting unit 12 receives the switching information based on the switching control signal input from the switching unit 22 to the selector unit 11 through the control unit 14. In the case of receiving the switching information ("Yes" in step S103), the threshold value that is recorded in the memory 103 of the signal level comparing unit 123 is initialized (step S104), and the processing proceeds to the next step S105.

If the switching information is not received ("No" in step S103), the processing proceeds to step S105 directly. Then, in step S102, the level of the signal calculated in step S102 and the threshold value of the memory 103 are compared with each other. If the threshold value of the memory 103 is initialized in step S104, the signal level calculated in step S102 is high ("Yes" in step S105), and thus the calculated signal level is recorded in the memory 103 as an initial value of the threshold value (step S106). The signal level is output to the gain calculation unit 124.

If the signal level calculated in step S102 is higher than the threshold value recorded in the memory 103 ("Yes" in step S105), the signal level calculated by the process in sep S102 is updated and recorded in the memory 103 (step S106), and the signal level is output to the gain calculation unit 124. On the other hand, if the signal level calculated in step S105 is lower than the threshold value of the memory 103 ("No" in step S105), the signal level is corrected on the basis of the current gain (step S111).

After the completion of the processing in step S106, the gain is calculated on the basis of the calculated signal level (step S107). Then, the calculated gain and the current gain are compared with each other (step S108). If the current gain is smaller than the calculated gain ("Yes" in step S108), the gain is increased, and the gain is set as a new gain (step S109). Then, the signal level is corrected on the basis of the increased gain (step S111).

If the current gain is larger than the calculated gain ("No" in step S108), the gain is decreased, and the gain is set as a new gain (step S110). Then, the signal level is corrected on the basis of the decreased gain (step S111).

Since the gain is not changed unless the signal level exceeds the threshold value through the above-described process, the user is prevented from feeling the sense of incongruity to the sound due to the frequent change of the gain. On the other hand, if the signal level exceeds the threshold value, the gain is decreased, and thus allophones due to the saturation of the acoustic signal in the case where the change of the level of the acoustic signal is big can be prevented from occurring. Further, in the case of the acoustic signal having a level that is higher than the level of the threshold value, the saturation of the acoustic signal can be prevented, and thus a comfort sound can be provided to the user. Further, it is possible to reduce user's efforts to manually adjust volume with respect to the change of the level of the acoustic signal according to a switching of the acoustic source.

Figure 7:
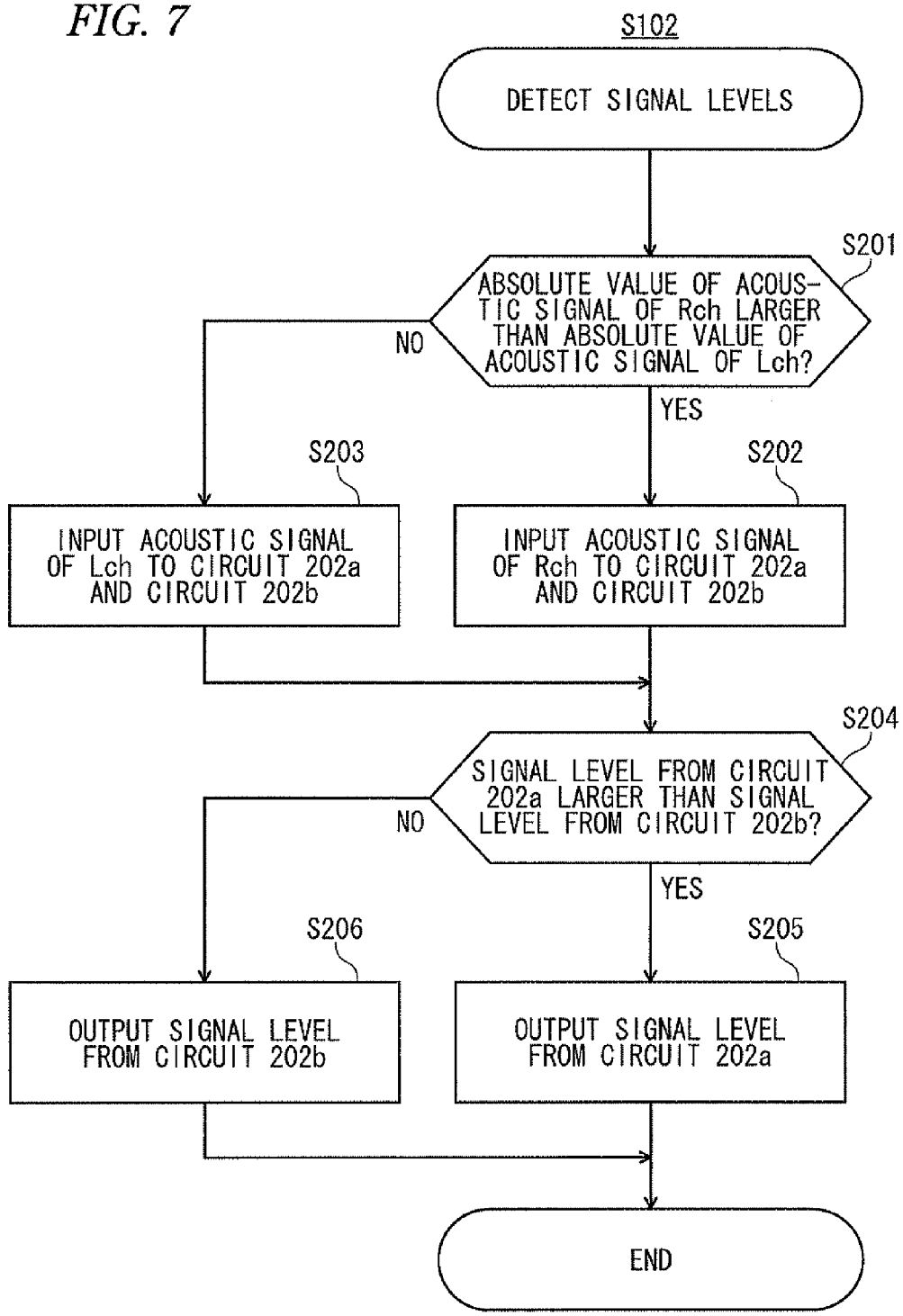
FIG. 7 is a flowchart illustrating the details of a signal level calculating process illustrated in FIG. 6.

Then, the details of the signal level calculating process in step S102 of FIG. 6 will be described using FIG. 7.

In calculating the signal levels, the absolute value of the acoustic signal (peak value of the acoustic signal) of the right channel Rch and the absolute value of the acoustic signal (peak value of the acoustic signal) of the left channel Lch are compared with each other, and if the absolute value of the acoustic signal of Rch is larger than that of Lch ("Yes" in step S201), the absolute value of the signal of Rch is selected. Then, the signal value of Rch is input to a plurality of integration circuits having different time constants (step S202). Here, the plurality of circuits include an integration circuit 202a having a relatively large time constant (a relatively long time period that is targeted for calculation) and an integration circuit 202b having a relative small time constant (a relatively short time period that is targeted for calculation).

If the signal level of Lch is higher than the signal level of Rch ("No" in step S201), the signal value of Lch is input to the plurality of integration circuits having different time constants (step S203).

Then, the signal levels of the signal input to the circuit 202a and the signal input to the circuit 202b are compared with each other. If the signal level of the circuit 202a is higher ("Yes" in sep S204), the signal level of the circuit 202a is output to the signal level comparing unit 123 (step S205), while if the signal level of the circuit 202b is higher ("No" in step S204), the signal level of the circuit 202b is input to the signal level comparing unit 123 (step S206). On the other hand, the plurality of integration circuits may additionally include an integration circuit having a different time constant in addition to the above-described two integration circuits.

Modified Examples of the First Embodiment

When changing the gain through comparison of the target gain with the current gain after the target gain is calculated, the gain of the acoustic signal may be change slowly from the current gain to the target gain, and the tracking speed (time interval until the next gain is updated) to the change of the signal level with respect to the gain width or gain control for once updating may be set to a predetermined value so that the temporal discontinuity does not occur in the acoustic signal. For example, by comparing a change speed with a change speed (a first speed according to the present invention) in the case of increasing the gain and making a change speed (a second speed according to the present invention) in the case of decreasing the gain fast, it becomes possible to rapidly lower the level of the acoustic signal in a state where there is a possibility that the acoustic signal is saturated. Further, by making the change speed in the case of increasing the gain slower than the change speed in the case of increasing the gain, it becomes possible to prevent the user from feeling the sense of incongruity to the increase of the volume. In the above-described description, "to change the gain slowly" means to interpose at least one intermediate value between the value before the change and the value after the change.

As the difference between the gain before the change and the gain after the change becomes larger, it is possible to add the increasing speed of the gain. Through this, it is possible to increase the sound to the signal level that is easy to hear without user's manual adjustment of the volume.

Then, the above-described modified example will be described using FIG. 8. In the processing flowchart of FIG. 8, the processing from step S108 to step S110 in FIG. 6 according to the first embodiment is replaced by a gain control in step S302. At a start of the processing, a timer 15 starts counting (step S301). Other processes are the same as those in FIG. 6.

Figure 8:
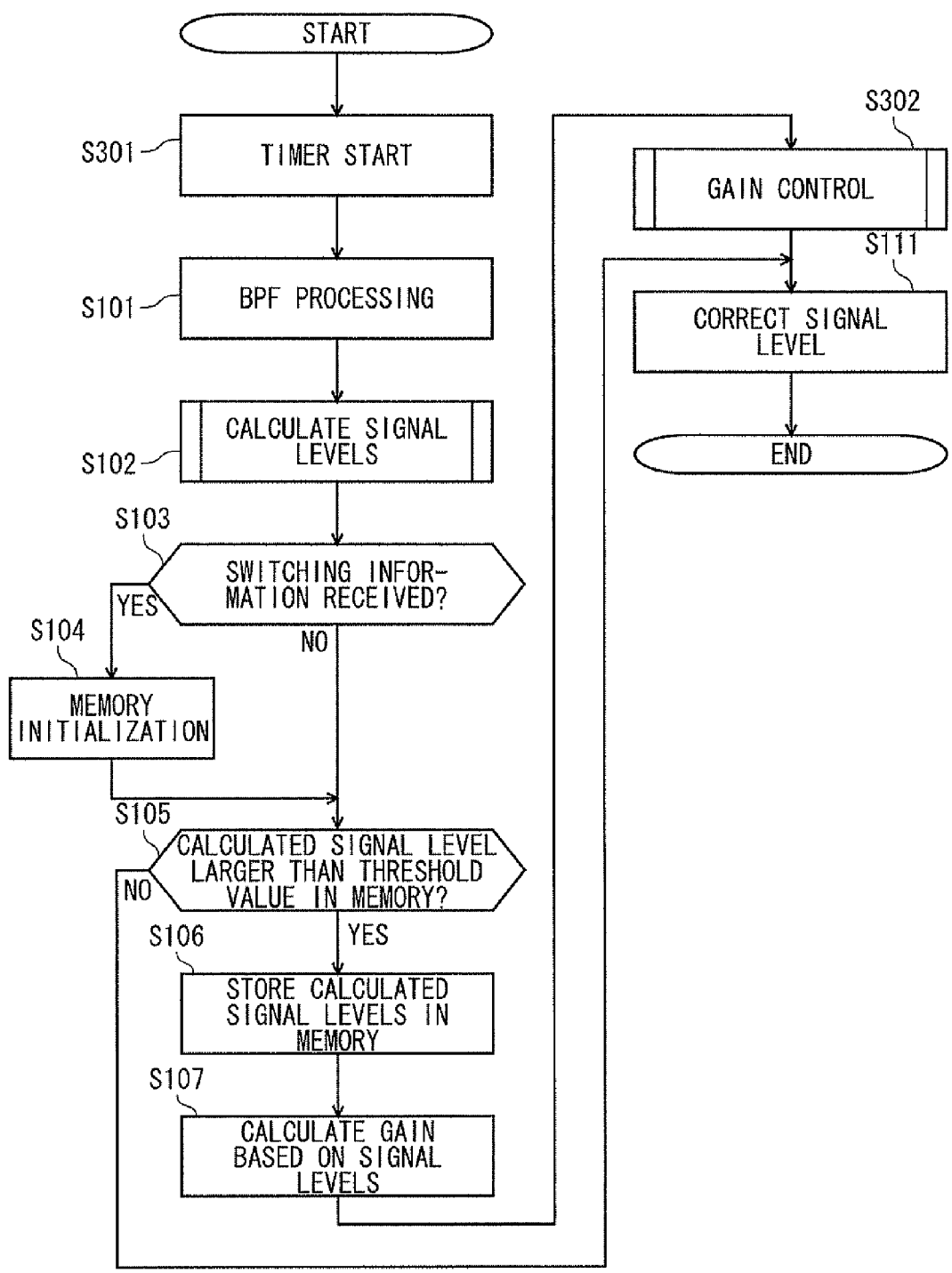
FIG. 8 is a flowchart illustrating a modified example of a process executed by the signal level correcting unit illustrated in FIG. 2.
Figure 9:
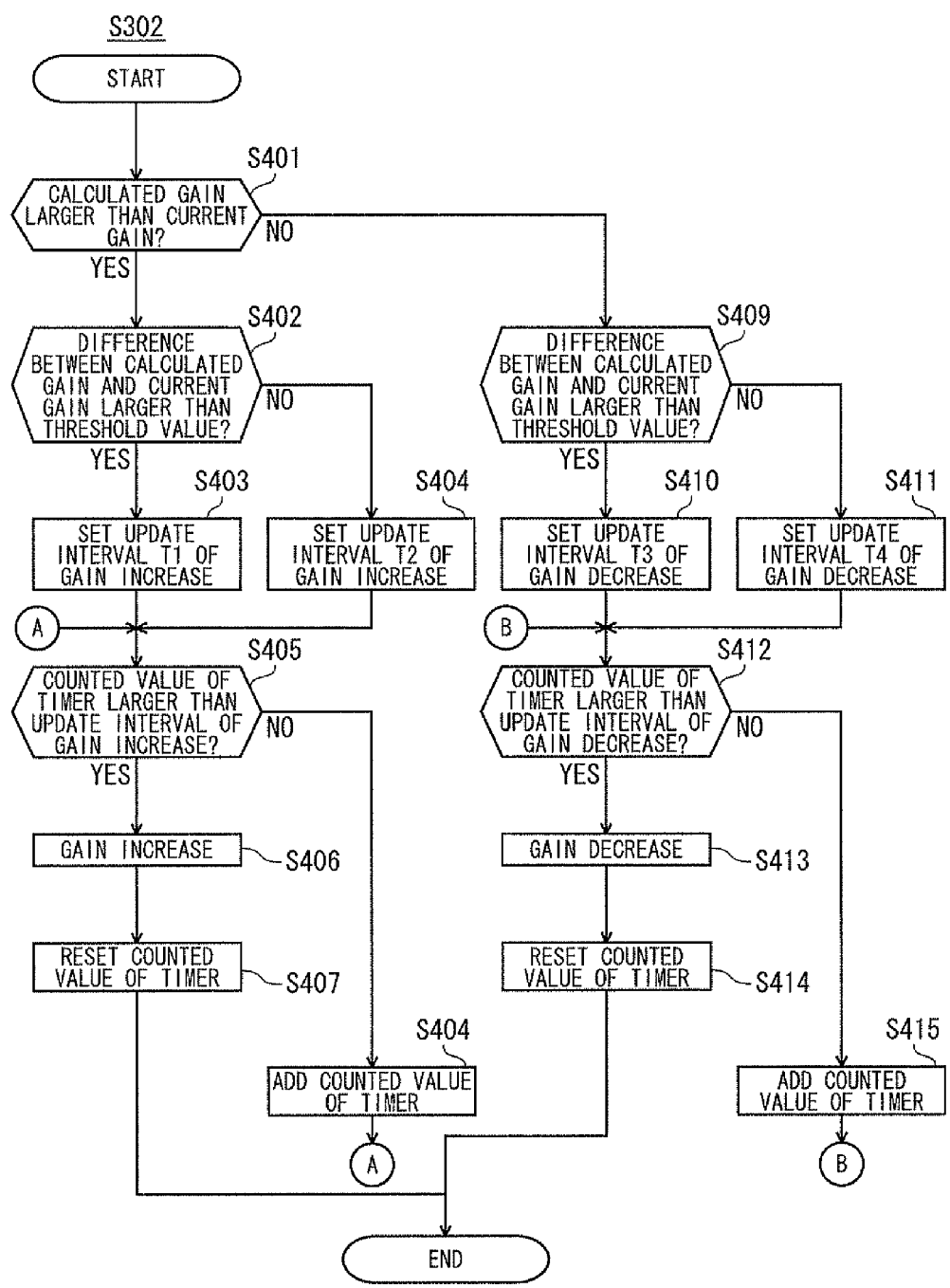
FIG. 9 is a flowchart illustrating the details of a gain control process illustrated in FIG. 8.

The details of the gain control in step S302 of FIG. 8 are shown in the flowchart of FIG. 9. First, the gain calculated by the gain calculating unit 124 is compared with the current gain in step S401. Then, if the calculated gain is larger than the current gain ("Yes" in step S401), a difference between the calculated gain and the current gain is obtained, and if the difference value is larger than a predetermined threshold value ("Yes" in step S402), the update interval (period) to increase the gain is set to T1 (step S403). Then, if the counted value of the timer 15 that has started the counting in step S301 of FIG. 8 becomes larger than the update interval T1 for the gain increase ("Yes" in step S405), the gain is increased (step S406). After the increase of the gain, the counted value of the timer 15 is reset (step S407), and the processing is terminated.

If the counted value of the timer 15 is smaller than the update interval T1 ("No" in step S405), the counted value of the timer 15 is added (step S408), and the processing returns to step S405 to repeatedly perform the comparison of the counted value of the timer 15 with the update interval T1.

If the difference value between the calculated gain and the current gain is smaller than the threshold value ("No" in step S402), an update interval T2 that is longer than the update interval T1 in step S403 is set (step S404), and the processing after step S405 is performed on the basis of the update interval T2. Through this, if the difference between the calculated gain and the current gain is larger than the predetermined threshold value, the gain is increased in a short interval (period), and thus the gain increase speed can be heightened. Further, if the difference between the calculated gain and the current gain is smaller than the predetermined threshold value, the gain is increased in a long interval (period), and thus the gain increase speed can be lowered. As described above, by correcting the signal level according to the required amount of gain control, comfort sound can be provided to the user.

If the calculated gain is smaller than the current gain ("No" in step S401), the difference between the calculated gain and the current gain is obtained, and if the difference value is larger than the predetermined threshold value ("Yes" in step S409), the update interval (period) to decrease the gain is set to T3 (step S410). Then, if the counted value of the timer 15 that has started the counting in step S301 of FIG. 8 becomes larger than the update interval T3 ("Yes" in step S412), the gain is decreased (step S413). After the decrease of the gain, the counted value of the timer 15 is reset (step S414), and the processing is terminated.

If the counted value of the timer 15 is smaller than the update interval T3 ("No" in step S412), the counted value of the timer 15 is added (step S415), and the processing returns to step S412 to repeatedly perform the comparison of the counted value of the timer 15 with the update interval T3.

If the difference value between the calculated gain and the current gain is smaller than the threshold value ("No" in step S409), an update interval T4 that is longer than the update interval T3 in step S403 is set (step S411). The processing after step S412 is performed on the basis of the update interval T4. Through this, if the difference between the calculated gain and the current gain is larger than the predetermined threshold value, the gain is decreased in a short interval (period), and thus the gain decrease speed can be heightened. Further, if the difference between the calculated gain and the current gain is smaller than the predetermined threshold value, the gain is decreased in a long interval (period), and thus the gain decrease speed can be lowered. As described above, by correcting the signal level according to the required amount of gain control, comfort sound can be provided to the user.

Second Embodiment

3-1. Configuration

Figure 10:
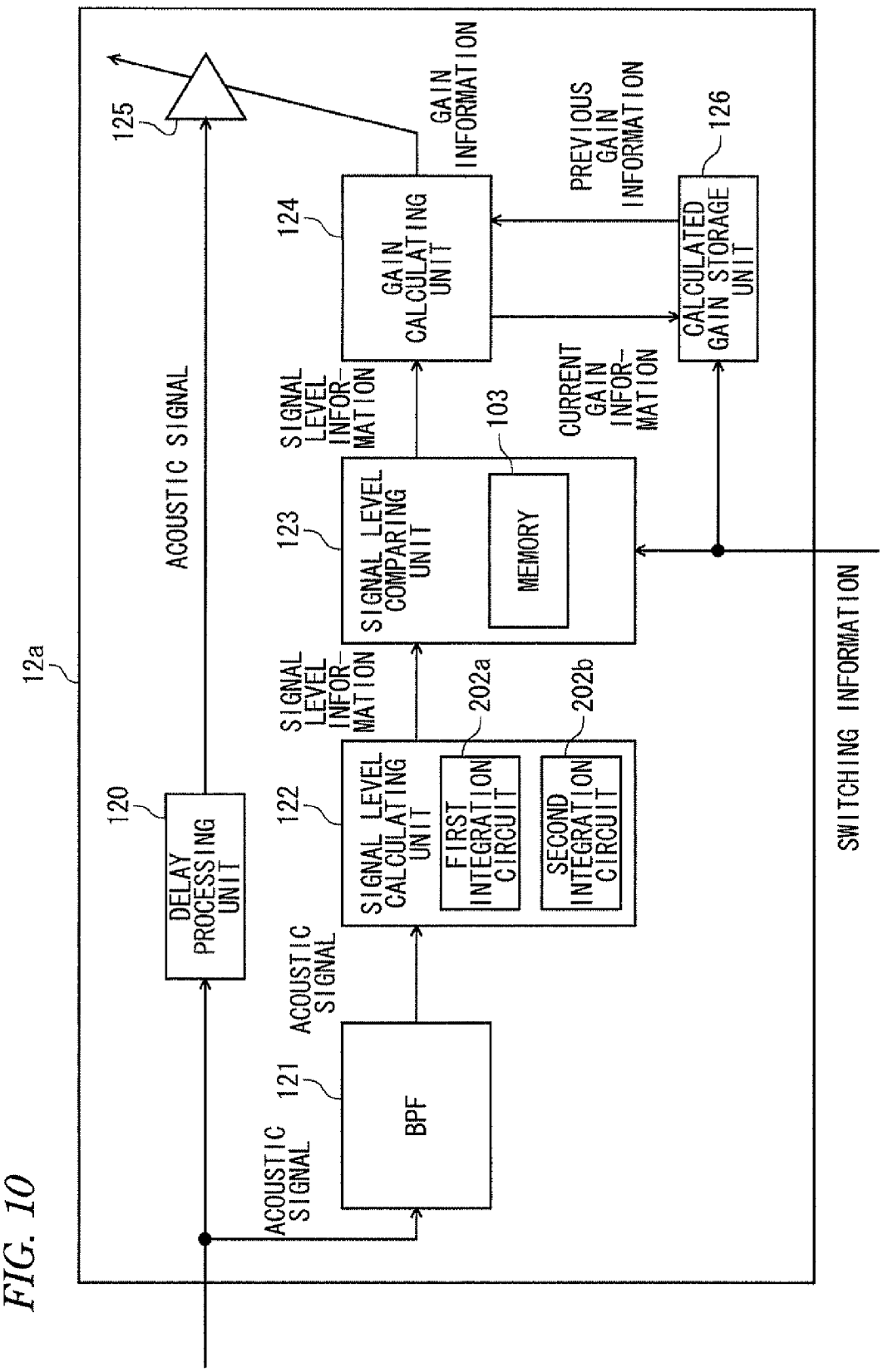
FIG. 10 is a block diagram illustrating a signal level correcting unit of an acoustic device according to a second embodiment of the present invention.

FIG. 10 is a block diagram illustrating a signal level correcting unit of an acoustic device according to a second embodiment of the present invention. The signal level correcting unit according to the second embodiment is different from the signal level correcting unit according to the first embodiment as illustrated in FIG. 2 on the point that a calculated gain recording unit 126 is newly provided in the signal level correcting unit 12 to form a signal level correcting unit 12a. Other configurations are the same as those as illustrated in FIG. 2.

In the calculated gain recording unit 126, the gain of the source before switching of the acoustic source is recorded. In the case where the gain according to the source selected by the switching is recorded in the calculated gain recording unit 126, the gain according to the selected source is read out. That is, if the source selected by the switching is the source of which the gain was calculated in the past, the gain information is stored in the calculated gain recording unit 126, and the gain of the acoustic signal of the acoustic source selected by the input of the switching information from the selector unit 11 is read out. Through this, the gain calculation according to the switching of the source becomes unnecessary, and an optimum sound can be rapidly provided to the user through the shortening of the gain calculation time.

On the other hand, if the gain is not recorded in the calculated gain recording unit 126, the gain calculation is performed in the same manner as the first embodiment, and the optimum sound according to the acoustic sound can be provided to the user.

3-2. Operation

Figure 11:
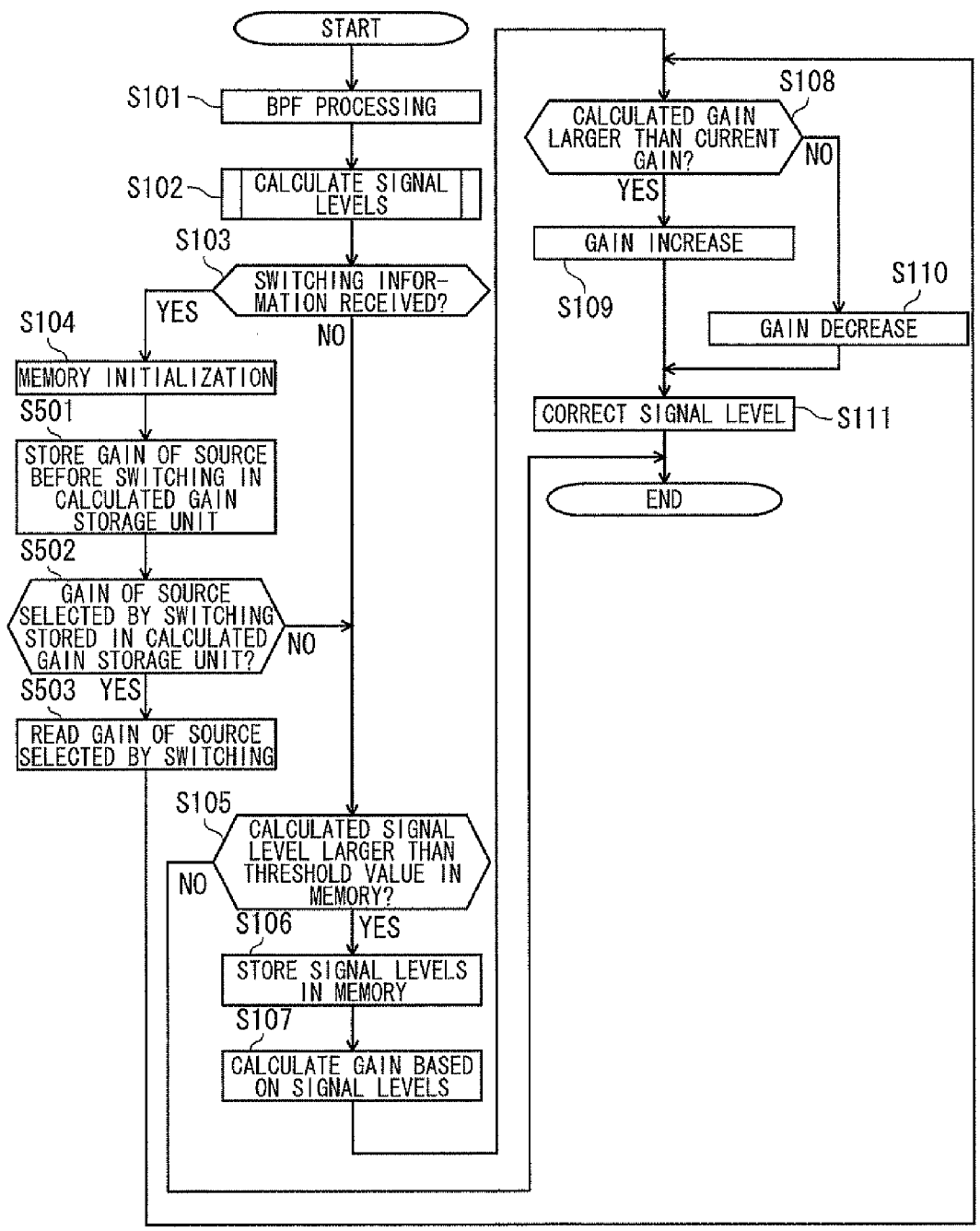
FIG. 11 is a flowchart illustrating a process executed by the signal level correcting unit illustrated in FIG. 10.

FIG. 11 illustrates a process executed by the signal level correcting unit according to the second embodiment. The process executed by the signal level correcting unit according to the second embodiment is different from the process executed by the signal level correcting unit according to the first embodiment as illustrated in FIG. 6 on the point that processing from step S501 to step S503 is added after the initialization of the memory in step S104. Other processes are the same as those according to the first embodiment.

If the signal level correcting unit 12 receives the switching information based on the switching signal of the acoustic source from the switching unit 22 to the selector unit 11 through the control unit 14 ("Yes" in step S103), the threshold value that is recorded in the memory 103 of the signal level comparing unit 123 is initialized (step S104).

Then, the gain of the source before the switching is recorded in the calculated gain recording unit 126 (step S501). Then, it is determined whether the gain of the source after the switching, which is the source selected by the switching, is recorded in the calculated gain recording unit 126 (step S502). If the gain of the source selected by the switching is recorded, the gain of the source selected by the switching is read from the calculated gain recording unit 126 (step S503), and the processing proceeds to the next step S108. The following process is the same as the process described with reference to FIG. 6.

If the gain of the source selected by the switching is not recorded ("No" in step S502), the gain calculating process is performed (step S105). The following process is the same as the process described with reference to FIG. 6.

Third Embodiment

4-1. Configuration

Figure 12:
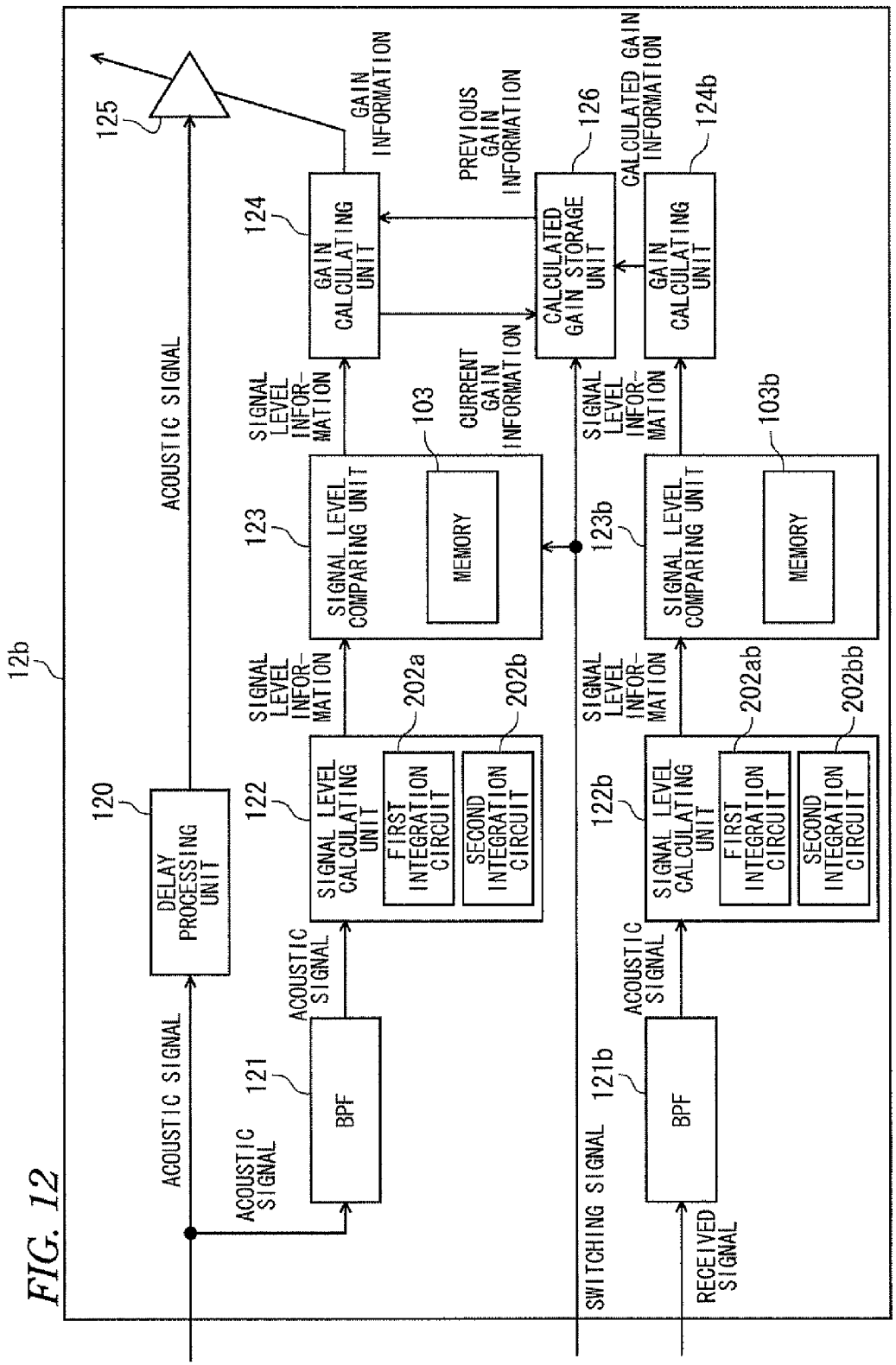
FIG. 12 is a block diagram illustrating a signal level correcting unit of an acoustic device according to a third embodiment of the present invention.

FIG. 12 is a block diagram illustrating a signal level correcting unit of an acoustic device according to a third embodiment of the present invention. The signal level correcting unit according to the third embodiment is different from the signal level correcting unit according to the second embodiment as illustrated in FIG. 10 on the point that in the second embodiment, one BPF 121, one signal level calculation unit 122, one signal level comparing unit 123, and one gain calculation unit 124 are provided, whereas in the third embodiment, a plurality (two in this embodiment) of the same units are provided.

The additionally provided BPF 121b, the signal level calculating unit 122b (including a first integration circuit 202ab and a second integration circuit 202bb), the signal level comparing unit 123b (including a memory 103b), and the gain calculating unit 124b calculate the gain of the acoustic signal of the acoustic source with respect to the broadcasting waves in the case where the acoustic source selected by the switching when the acoustic device 1 receives the broadcasting waves is the acoustic source except for the acoustic sources for the broadcasting waves (for example, AM radio, FM radio, DTV, and the like). Through this, in parallel to the reproduction of sound of the acoustic source being selected, the gain can be recorded by performing the gain calculation of a separate source in advance, and thus the optimum sound according to the acoustic sound can be provided to the user.

4-2. Operation

Figure 13:
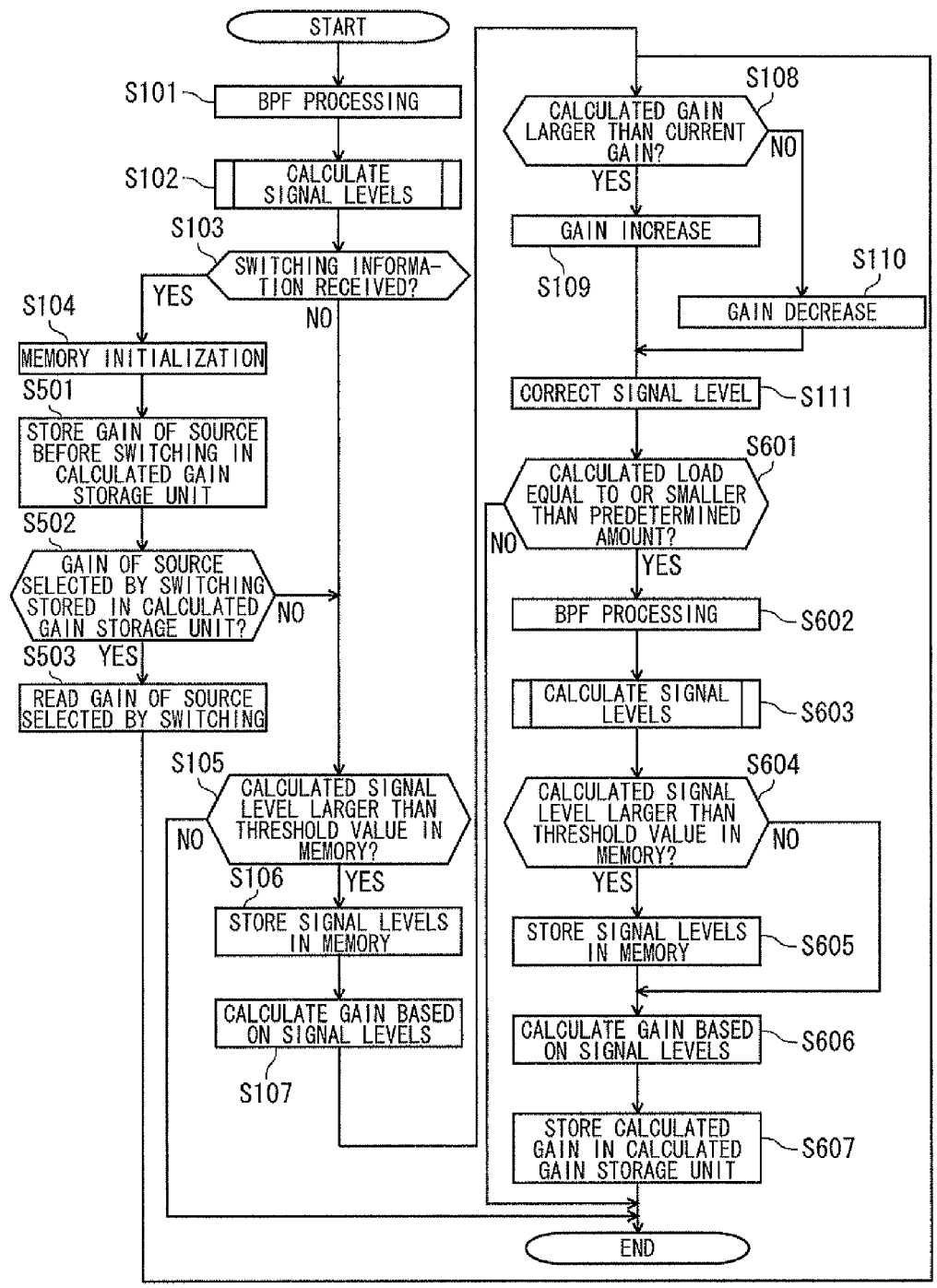
FIG. 13 is a flowchart illustrating a process executed by the signal level correcting unit illustrated in FIG. 12.

FIG. 13 illustrates a process executed by the signal level correcting unit according to the third embodiment. The process executed by the signal level correcting unit according to the third embodiment is different from the process executed by the signal level correcting unit according to the second embodiment as illustrated in FIG. 11 on the point that a gain calculating process of the broadcasting waves is performed in steps S601 to S607 after the signal level correction in step S111. Other processes are the same as those according to the first embodiment.

After the correction of the signal level is performed on the basis of the gain determined according to the source being selected in step S111, it is determined whether a load of the gain calculation according to the correction of the signal level is equal to or smaller than a predetermined amount (step S601). If the calculated load is not equal to or smaller than the predetermined amount ("No" in step S601), the processing is terminated.

If the calculated load is equal to or smaller than the predetermined amount ("Yes" in step S601), the same BPF process as in step S101 is performed with respect to the received broadcasting waves (step S602), and the same signal level calculation is performed (step S603).

Then, the signal level calculated in step S603 and the threshold value in the memory 103b are compared with each other (step S604). If the calculated signal level is larger than the threshold value of the memory ("Yes" in step S604), the processing proceeds to the next step S605, and in the same manner as step S106, the signal level is updated and recorded in the memory 103b (step S606). Then, in the same manner as step S107, the gain is calculated on the basis of the calculated signal level (step S606), and the calculated gain is recorded in the calculated gain recording unit 126 (step S607).

If the calculated signal level is smaller than the threshold value in the memory ("No" in step S604), the gain is calculated on the basis of the threshold value in the memory 103b (step S606). The calculated gain is recorded in the calculated gain recording unit 126 (step S607).

As described above, although the embodiments of the present invention have been described, the present invention is not limited to the above-described embodiments, but various modifications may be made.

Although the respective processes in the flowcharts explaining the respective embodiments are shown in a series for convenience, the respective subdivided processes may be performed in parallel by a multitasking control function.

Priority is claimed on Japanese Patent Application No. 2010-101784 filed in the Japan Patent Office on Apr. 27, 2010, the contents of which are incorporated herein by reference.

The invention claimed is:

1. An acoustic device configured to reproduce an acoustic signal of one acoustic source which is selected from a plurality of acoustic sources, the acoustic device comprising:
    a first averaging unit configured to average signal levels of the acoustic signal for a first calculation time period;
    a second averaging unit configured to average the signal levels of the acoustic signal for a second calculation time period which is shorter than the first calculation time period;
    a selecting unit configured to select one signal from among signals output from the first averaging unit and the second averaging unit, the one signal having a signal level higher than the other;

a determining unit configured to determine whether the signal level of the selected one signal is higher than a threshold value which is determined according to the one acoustic source;

a gain decreasing unit configured to decrease a gain of the acoustic signal according to the signal level of the one signal, in a case where the signal level of the selected one signal is higher than the threshold value;

a correcting unit configured to correct a signal level of the acoustic signal according to the gain; and a threshold value updating unit configured to update the threshold value so as to be the same value as the signal level of the selected one signal, in a case where the signal level of the selected one signal is higher than the threshold value.

2. The acoustic device according to claim 1, wherein the threshold value updating unit updates the threshold value so as to be the same value as a peak signal level of the selected one signal.

3. The acoustic device according to claim 1, further comprising:

a switching unit configured to switch the acoustic source from among the plurality of acoustic sources, according to an operation of a user; and a threshold value setting unit configured to set, in response to switching of the acoustic source, an initial value of the threshold value according to the acoustic source after the switching, based on a signal level of a signal which is selected by the selecting unit after the switching.

4. The acoustic device according to claim 1, wherein the threshold value is initialized at a switching timing from the one acoustic source to another acoustic source.

5. A method of controlling a gain for reproducing an acoustic signal of one acoustic source which is selected from a plurality of acoustic sources, the method comprising:

(a) averaging signal levels of the acoustic signal for a first calculation time period;

(b) averaging the signal levels of the acoustic signal for a second calculation time period which is shorter than the first calculation time period;

(c) selecting one signal from among signals output from the step (a) and the step (b), the one signal having a signal level higher than the other;

(d) determining whether the signal level of the selected one signal is higher than a threshold value which is determined according to the one acoustic signal;

(e) decreasing a gain of the acoustic signal according to the signal level of the one signal, in a case where the signal level of the selected one signal is higher than the threshold value;

(f) correcting a signal level of the acoustic signal according to the gain; and updating the threshold value so as to be the same value as the signal level of the selected one signal, in a case where the signal level of the selected one signal is higher than the threshold value.

6. The acoustic device according to claim 5, wherein the threshold value is initialized at a switching timing from the one acoustic source to another acoustic source.

\* \* \* \* \*